(12) United States Patent
Zhang et al.

(10) Patent No.: US 12,329,008 B2
(45) Date of Patent: Jun. 10, 2025

(54) DISPLAY DEVICES AND DISPLAY PANELS

(71) Applicant: KunShan Go-Visionox Opto-Electronics Co., Ltd., Kunshan (CN)

(72) Inventors: Lu Zhang, Kunshan (CN); Miao Chang, Kunshan (CN); Ji Xu, Kunshan (CN); Zhenzhen Han, Kunshan (CN); Siming Hu, Kunshan (CN)

(73) Assignee: KunShan Go-Visionox Opto-Electronics Co., Ltd., Kunshan (CN)

(*) Notice: Subject to any disclaimer, the term of this patent is extended or adjusted under 35 U.S.C. 154(b) by 860 days.

(21) Appl. No.: 17/541,027

(22) Filed: Dec. 2, 2021

(65) Prior Publication Data

US 2022/0093702 A1 Mar. 24, 2022

Related U.S. Application Data

(63) Continuation of application No. PCT/CN2020/084958, filed on Apr. 15, 2020.

(30) Foreign Application Priority Data

Nov. 22, 2019 (CN) .......................... 201911157499.6

(51) Int. Cl.
*H10K 59/35* (2023.01)
*H10K 50/818* (2023.01)
(Continued)

(52) U.S. Cl.
CPC ......... *H10K 59/353* (2023.02); *H10K 50/818* (2023.02); *H10K 59/131* (2023.02); *H10K 59/80518* (2023.02)

(58) Field of Classification Search
CPC .. H10K 59/353; H10K 50/818; H10K 59/131; H10K 59/80518; H10K 59/35; G09G 3/3225; G09G 2300/0452
See application file for complete search history.

(56) References Cited

U.S. PATENT DOCUMENTS

2017/0317150 A1 11/2017 Chung et al.
2019/0011830 A1* 1/2019 Ji ........................... H10K 71/00
(Continued)

FOREIGN PATENT DOCUMENTS

CN 106873205 A 6/2017
CN 109036245 A 12/2018
(Continued)

OTHER PUBLICATIONS

ISA State Intellectual Property Office of the People's Republic of China, International Search Report Issued in Application No. PCT/CN2020/084958, Aug. 25, 2020, WIPO, 4 pages.
(Continued)

*Primary Examiner* — Patricia D Valenzuela
(74) *Attorney, Agent, or Firm* — Maier & Maier, PLLC

(57) ABSTRACT

A display device and a display panel thereof. The display panel has a display area and a frame area, where the display panel includes second pixel units disposed in the display area, and each of the second pixel units include: first sub-pixels, second sub-pixels and third sub-pixels alternately distributed in a column direction and emit three different primary colors respectively, and sub-pixels emitting a same color in each of the second pixel units are synchronously controlled to emit light. The display panel further includes color deviation adjustment sub-pixels disposed in the display area and between the second pixel units and the frame area, and the color deviation adjustment sub-pixels are independently controlled to emit light.

20 Claims, 4 Drawing Sheets

(51) Int. Cl.
  *H10K 59/131* (2023.01)
  *H10K 59/80* (2023.01)

(56) References Cited

U.S. PATENT DOCUMENTS

| | | | |
|---|---|---|---|
| 2019/0244557 | A1 | 8/2019 | Deering et al. |
| 2019/0326366 | A1* | 10/2019 | Fan .................. H10K 59/35 |
| 2020/0050063 | A1 | 2/2020 | Yoshida |

FOREIGN PATENT DOCUMENTS

| | | | |
|---|---|---|---|
| CN | 109065592 | A | 12/2018 |
| CN | 110112189 | A | 8/2019 |
| CN | 110168438 | A | 8/2019 |
| CN | 110265448 | A | 9/2019 |
| CN | 110828529 | A | 2/2020 |

OTHER PUBLICATIONS

ISA State Intellectual Property Office of the People's Republic of China, Written Opinion of the International Searching Authority Issued in Application No. PCT/CN2020/084958, Aug. 25, 2020, WIPO, 6 pages.
State Intellectual Property Office of the People's Republic of China, Office Action and Search Report Issued in Application No. 2019111574996, Jul. 10, 2020, 11 pages.
State Intellectual Property Office of the People's Republic of China, Office Action and Search Report Issued in Application No. 2019111574996, Oct. 13, 2020, 10 pages.
State Intellectual Property Office of the People's Republic of China, Office Action and Search Report Issued in Application No. 2019111574996, Dec. 17, 2020, 13 pages.

* cited by examiner

DISPLAY DEVICES AND DISPLAY PANELS

CROSS REFERENCE TO RELATED APPLICATIONS

The present application is a continuation application of International Application No. PCT/CN2020/084958 filed on Apr. 15, 2020, which claims priority to Chinese Patent Application No. 201911157499.6, filed on Nov. 22, 2019, both of which are hereby incorporated by reference in their entireties.

TECHNICAL FIELD

This application relates to the technical field of display devices.

BACKGROUND

With the rapid development of display devices, users have increasingly higher demands on screen-to-body ratio. Since components such as cameras, sensors, earpieces and the like need to be installed in a top area of a display screen, a part of the top area of the display screen is usually reserved for installing the above components. The part of the top area affects the overall consistency of the screen and full-screen display.

SUMMARY

The present application provides a display device for a full screen and a display panel thereof.

A first aspect of the present application provides a display panel, having a frame area and a display area, wherein the display panel includes at least one second pixel unit and a plurality of color deviation adjustment sub-pixel, wherein each of the at least one second pixel unit includes: a plurality of first sub-pixels, a plurality of second sub-pixels and a plurality of third sub-pixels alternately distributed in a column direction and emitting three different primary colors respectively, and sub-pixels emitting a same color in each of the at least one second pixel unit are synchronously controlled to emit light; the plurality of color deviation adjustment sub-pixels are disposed in the display area and between the at least one second pixel unit and the frame area, and the plurality of color deviation adjustment sub-pixels are independently controlled to emit light.

A second aspect of the present application provides a display device including the above-mentioned display panel.

In the display area of the present application, the plurality of color deviation adjustment sub-pixels are provided close to the frame area, and the plurality of color deviation adjustment sub-pixels are independently controlled to emit light. Since the plurality of color deviation adjustment sub-pixels are controlled to emit light independently and can be adjusted separately, color deviation problems at an edge of the display area close to the frame area can be prevented.

DETAILED DESCRIPTION OF THE EMBODIMENTS

In order to make the above objects, features and advantages of the present application more apparent and understandable, embodiments of the present application will be described in detail below with reference to the accompanying drawings.

Figure 1:
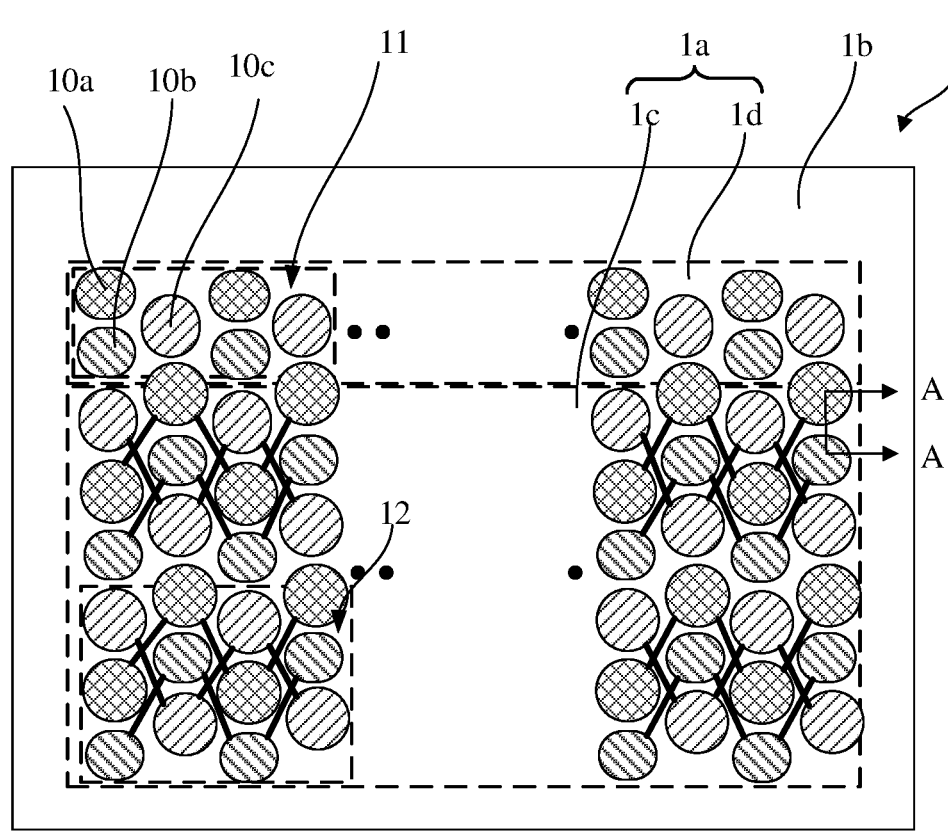
FIG. 1 is a top view of a display panel according to embodiments of the present application.

FIG. 1 is a top view of a display panel according to an embodiment of the present application.

Referring to FIG. 1, a display panel 1 has a display area 1a and a frame area 1b. The display panel 1 includes at least one second pixel unit 12 disposed in the display area 1a, each of the at least one second pixel unit 12 includes a plurality of first sub-pixels 10a, a plurality of second sub-pixels 10b and a plurality of third sub-pixel 10c alternately distributed in a column direction, and a plurality of sub-pixels emitting a same color in each of the at least one second pixel unit 12 are synchronously controlled to emit light. The display panel 1 further includes a plurality of color deviation adjustment sub-pixels disposed in the display area 1a and between the at least one second pixel unit 12 and the frame area 1b, and the plurality of color deviation adjustment sub-pixels are independently controlled to emit light. The plurality of first sub-pixels 10a, the plurality of second sub-pixels 10b, and the plurality of third sub-pixels 10c emits a color selected from three primary colors and different from each other.

Referring to FIG. 1, the display panel 1 includes at least one first pixel unit 11 and at least one second pixel unit 12, the at least one first pixel unit 11 is close to the frame area 1b, and the at least one second pixel unit 12 is away from the frame area 1b. Each of the at least one first pixel unit 11 includes a plurality of sub-pixels, the plurality of sub-pixels including three rows of first sub-pixels 10a, second sub-pixels 10b, and third sub-pixels 10c alternately distributed in the column direction, and each row of the at least one first pixel unit 11 includes a plurality of sub-pixels emitting a same color.

In some embodiments, the plurality of first sub-pixels 10a, the plurality of second sub-pixels 10b, and the plurality of third sub-pixels 10c in each of the at least one second pixel unit 12 are disposed in 3N rows and alternately distributed in the column direction, where N≥2, and a plurality of sub-pixels emitting a same color located in an Nth row in each of the at least one second pixel unit 12 are electrically connected with each other.

In the embodiment shown in FIG. 1, in each of the at least one first pixel unit 11, the plurality of first sub-pixel 10a is closer to the frame area 1*b* than the plurality of second sub-pixels 10*b* and the plurality of third sub-pixels 10*c*, and therefore, the plurality of first sub-pixels 10*a* in the at least one first pixel unit 11 are the plurality of color deviation adjustment sub-pixels. In other embodiments, the plurality of second sub-pixels 10*b* are closer to the frame area 1*b* than other sub-pixels, and thus the plurality of second sub-pixels 10*b* closer to the frame area 1*b* are the plurality of color deviation adjustment sub-pixels; or the plurality of third sub-pixels 10*c* are closer to the frame area 1*b* than other sub-pixels, and thus the plurality of third sub-pixels 10*c* closer to the frame area 1*b* are the plurality of color deviation adjustment sub-pixels. In other words, the plurality of color deviation adjustment sub-pixels are selected from the first sub-pixels, the second sub-pixels or the third sub-pixels in the at least one first pixel unit.

Referring to FIG. 1, the display panel 1 has a transparent display area 1*c* and a non-transparent display area 1*d*; the display panel 1 includes at least one second pixel unit 12 disposed in the transparent display area 1*c*; the display panel 1 includes at least one first pixel unit 11 disposed in non-transparent display area 1*d*.

Figure 2:
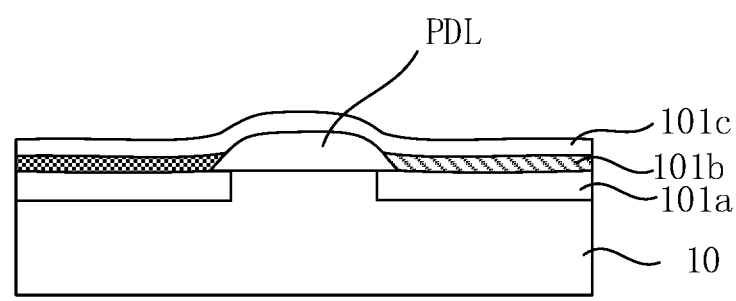
FIG. 2 is a sectional view along line A-A of the display panel shown in FIG. 1.

FIG. 2 is a sectional view along line A-A of the display panel shown in FIG. 1. Referring to FIG. 2, a plurality of first electrodes 101*a* are provided on a substrate 10, and a pixel definition layer (PDL) is provided on the plurality of first electrodes 101*a* and on a part of the substrate 10 not covered with the plurality of first electrodes 101*a*. The PDL has openings for exposing a part area of the plurality of first electrodes 101*a*, a plurality of light-emitting structure blocks 101*b* are provided in the openings, and a plurality of second electrodes 101*c* are provided on the light-emitting structure blocks 101*b* and the PDL. The plurality of light-emitting structure blocks 101*b* can emit red, green, or blue colors, or red, green, blue, or yellow colors. The plurality of light emitting structure blocks 101*b* can be organic light emitting material (OLED). The plurality of first electrodes 101*a* can be anodes, and the plurality of second electrodes 101*c* can be cathodes.

In some embodiments, a plurality of first electrodes 101*a* of the plurality of first sub-pixels 10*a*, the plurality of second sub-pixels 10*b* and the plurality of third sub-pixels 10*c* in the at least one first pixel unit 11 are reflective anodes, for example, a material of the reflective anodes can include indium tin oxide (ITO), metallic silver, or ITO with laminated structure and so on.

In some embodiments, a plurality of first electrodes 101*a* of the plurality of first sub-pixels 10*a*, the plurality of second sub-pixels 10*b*, and the plurality of third sub-pixels 10*c* in the at least one second pixel unit 12 are light-transmitting anodes, for example, a material of the light-transmitting anodes can include ITO for transparent display. In other embodiments, the plurality of first electrodes 101*a* of the plurality of first sub-pixels 10*a*, the plurality of second sub-pixels 10*b*, and the plurality of third sub-pixels 10*c* in the at least one second pixel unit 12 are reflective anodes, for example, a material of the reflective anodes includes ITO, metallic silver, or ITO with laminated structure and so on. In the present application, the at least one second pixel unit 12 is used for displaying, and the PDL between the plurality of sub-pixels 10*a*, 10*b*, and 10*c* are used for transmitting light. In each of the at least one second pixel unit 12, by connecting the plurality of first electrodes 101*a* of respective sub-pixels 10*a* with each other, connecting the plurality of first electrodes 101*a* of respective sub-pixels 10*b* with each other, and connecting the plurality of first electrodes 101*a* of respective sub-pixels 10*c* with each other, the respective sub-pixels 10*a* in the Nth row in the at least one second pixel unit 12 can be electrically connected with each other, the respective sub-pixels 10*b* in the Nth row in the at least one second pixel unit 12 can be electrically connected with each other, and the respective sub-pixels 10*c* in the Nth row in the at least one second pixel unit 12 can be electrically connected with each other. In some embodiments, as shown in FIG. 1, in each of the at least one second pixel unit 12, connecting lines between the plurality of first electrodes 101*a* of respective sub-pixels 10*a* form a broken line, connecting lines between the plurality of first electrodes 101*a* of respective sub-pixels 10*b* form a broken line, and connecting lines between the plurality of first electrodes 101*a* of respective sub-pixels 10*c* form a broken line. In some embodiments, other patterns of the connecting lines can be formed.

A plurality of second electrodes 101*c* of the plurality of first sub-pixels 10*a*, the plurality of second sub-pixels 10*b* and the plurality of third sub-pixels 10*c* in the at least one first pixel unit 11 and the at least one second pixel unit 12 are partially light-transmitting and partially light-reflecting, for example, a material of the second electrodes can include one of metal magnesium, metallic silver and a mixture thereof. The plurality of second electrodes 101*c* of respective sub-pixels 10*a*, 10*b*, and 10*c* can be connected to form a surface electrode.

As shown in FIG. 1, the at least one first pixel unit 11 is arranged in one row; in other embodiments, the at least one first pixel unit 11 can be arranged in two or more rows. In addition, the present application does not limit a number of rows arranging the at least one second pixel unit 12.

Each of the at least one second pixel unit 12 can include a plurality of first sub-pixels 10*a* arranged in N rows and M columns, a plurality of second sub-pixels 10*b* arranged in N rows and M columns, and a plurality of third sub-pixels 10*c* arranged in N rows and M columns, where N≥2, M≥2. In some embodiments, as shown in FIG. 1, each of the at least one second pixel unit 12 includes, for example, four first sub-pixels 10*a* arranged in two rows and four columns, four second sub-pixels 10*b* arranged in two rows and four columns, and four third sub-pixels 10*c* arranged in two rows and four columns; where the first electrodes 101*a* of the four first sub-pixels 10*a* are connected with each other, the first electrodes 101*a* of the four second sub-pixels 10*b* are connected with each other, and the first electrodes 101*a* of the four third sub-pixels 10*c* are connected with each other.

Each of the at least one first pixel unit 11 can include a plurality of first sub-pixels 10*a* arranged in one row and P columns, a plurality of second sub-pixels 10*b* arranged in one row and P columns, and a plurality of third sub-pixels 10*c* arranged in one row and P columns, where P is an even number, and P≥2. In some embodiments, as shown in FIG. 1, each of the at least one first pixel unit 11 includes a plurality of first sub-pixels 10*a* arranged in one row and two columns, a plurality of second sub-pixels 10*b* arranged in one row and two columns, and a plurality of third sub-pixels 10*c* arranged in one row and two columns.

Figure 3:
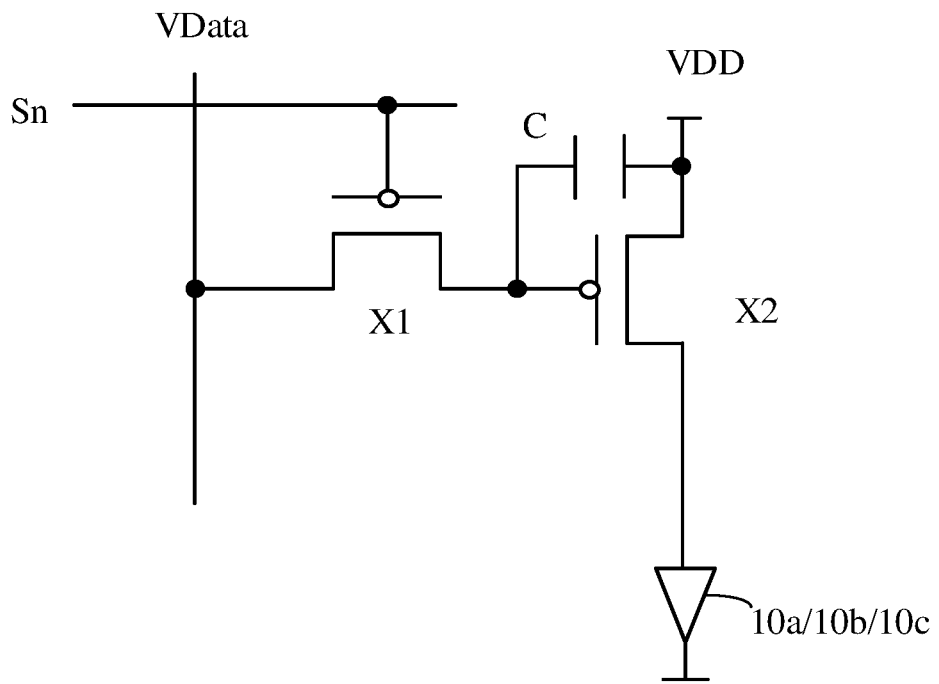
FIG. 3 is a circuit diagram of a pixel driving circuit of a 2T1C structure.

FIG. 3 is a circuit diagram of a pixel driving circuit of a 2T1C structure. In FIG. 2, each of the at least one first pixel unit 11 and each of the at least one second pixel unit 12 are actively driven to emit light, and a plurality of first electrodes 101*a* of respective sub-pixels 10*a*, 10*b*, 10*c* are connected to pixel driving circuits.

As shown in FIG. 3, each pixel driving circuit includes a switching transistor X1, a driving transistor X2, and a storage capacitor C.

A gate of the switching transistor X1 is electrically connected to a scan signal line Sn. When a scan signal of the scan signal line is a turn-on voltage, the switching transistor X1 holds a data signal in a column data signal line VData on a plate of the storage capacitor C. When a scan signal of the scan signal line is a turn-off voltage, a data signal held on the storage capacitor C keeps the driving transistor X2 on, so that power signals in a power signal line VDD continuously supply power to the first electrodes 101a of respective sub-pixels 10a, 10b, and 10c.

In FIG. 1, the at least one first pixel unit 11 is located in the non-transparent display area 1d. Therefore, in the at least one first pixel unit 11, for each first sub-pixel 10a, the first sub-pixel 10a (that is, a first electrode 101a of a first sub-pixel 10a) can be connected to one pixel driving circuit; for each second sub-pixel 10b, the second sub-pixel 10b (that is, a first electrode 101a of a second sub-pixel 10b) can be connected to one pixel driving circuit; and for each third sub-pixel 10c, the third sub-pixel 10c (that is, a first electrode 101a of a third sub-pixel 10c) can be connected to one pixel driving circuit.

The at least one second pixel unit 12 is located in the transparent display area 1c. Therefore, in each of the at least one second pixel unit 12, all of first sub-pixels 10a (that is, first electrodes 101a of respective first sub-pixels 10a) can be connected to one pixel driving circuit, all of second sub-pixels 10b (that is, first electrodes 101a of respective second sub-pixels 10b) can be connected to one pixel driving circuit, and all of third sub-pixels 10c (that is, first electrodes 101a of respective third sub-pixels 10c) can be connected to one pixel driving circuit; and these pixel driving circuits are located in the transparent display area 1c. In this way, a number of pixel driving circuits can be reduced, thereby reducing an area occupied by a low transmittance area, and increasing an area ratio of high transmittance area (such as a planarization layer) to low transmittance area, and thus a transmittance of the transparent display area 1c is effectively ensured. In some embodiments, pixel driving circuits connected to the at least one second pixel unit 12 can be arranged in the non-transparent display area 1d or the frame area 1b.

Figure 4:
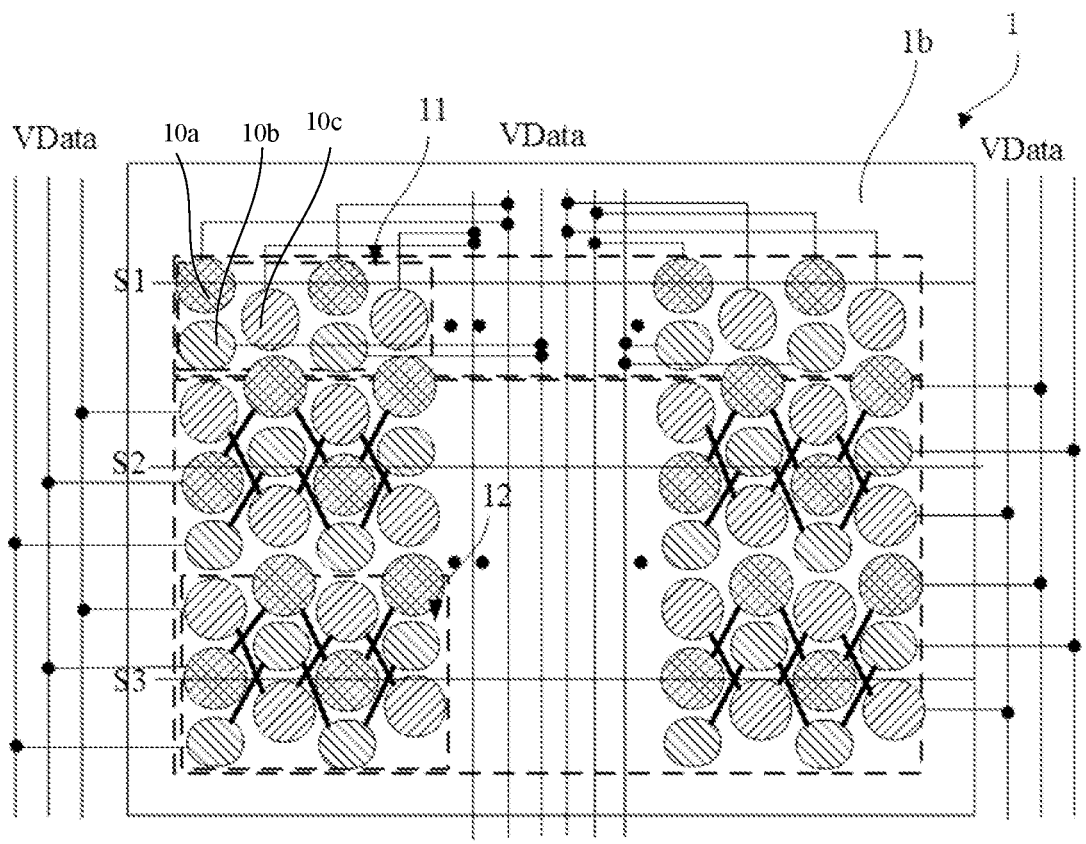
FIG. 4 is a schematic diagram illustrating a connecting relationship in which at least one first pixel unit and at least one second pixel unit in FIG. 1 are respectively connected with scan signal lines and data signal lines.

FIG. 4 is a schematic diagram illustrating a connecting relationship in which at least one first pixel unit and at least one second pixel unit in FIG. 1 and are respectively connected with scan signal lines and data signal lines.

As shown in FIG. 4, pixel driving circuits of respective sub-pixels 10a, 10b, 10c in the at least one first pixel unit 11 arranged in a first row are connected to a first scan signal line S1; pixel driving circuits of respective sub-pixels 10a, 10b, 10c in the at least one second pixel unit 12 arranged in a second row are connected to a second scan signal line S2; pixel driving circuits of respective sub-pixels 10a, 10b, 10c in the at least one second pixel unit 12 arranged in a third row are connected to a third scan signal line S3; the first scan signal line S1, the second scan signal line S2, and the third scan signal line S3 are different scan signal lines, and signals of respective scan signal lines S1, S2, S3 can come from one or more Gate In Panel (GIP) circuits. Pixel driving circuits of sub-pixels emitting a same color in respective first pixel units 11 arranged in a column are connected to a same data signal line VData; pixel driving circuits of sub-pixels emitting a same color in respective second pixel units 12 arranged in a column are connected to a same data signal line VData; and pixel driving circuits of sub-pixels emitting a same color in the at least one first pixel unit 11 and the at least one second pixel unit 12 arranged in a column are connected to different data signal lines VData. For example, in a case that the at least one first pixel unit 11 and the at least one second pixel unit 12 arranged in a column, pixel driving circuits for the plurality of first sub-pixels 10a in the at least one first pixel unit 11 are connected to a first data signal line VData, pixel driving circuits for the plurality of second sub-pixels 10b in the at least one first pixel unit 11 are connected to a second data signal line VData, and pixel driving circuits for the plurality of third sub-pixels 10c in the at least one first pixel unit 11 are connected to a third data signal line VData; pixel driving circuits for the sub-pixels 10a in the at least one second pixel unit 12 are connected to a fourth data signal line VData, pixel driving circuits for the plurality of second sub-pixels 10b in the at least one second pixel unit 12 are connected to a fifth data signal line VData, and pixel driving circuits for the plurality of third sub-pixels 10c in the at least one second pixel unit 12 are connected to a sixth data signal line VData. The first data signal line VData, the second data signal line VData and the third data signal line VData are different from each other. The fourth data signal line VData, the fifth data signal line VData and the sixth data signal line VData are different from each other.

Respective data signal lines VData can be originated from data signal channels of a Display Driver Integrate Circuit (DDIC).

When the first scan signal line S1 selects at least one first pixel unit 11 in a first row, different data signal lines VData input respective data signals into a plurality of first sub-pixels 10a and a plurality of second sub-pixels 10b and a plurality of third sub-pixels 10c in the at least one first pixel unit 11 arranged in different columns, respective first pixel units 11 emit light of corresponding brightness. When the second scan signal line S2 selects at least one second pixel unit 12 in a second row, different data signal lines VData input respective data signals into a plurality of first sub-pixels 10a, a plurality of second sub-pixels 10b and a plurality of third sub-pixels 10c in the at least one second pixel unit 12 arranged in different columns, respective second pixel units 12 emit light of corresponding brightness. When the third scan signal line S3 selects at least one second pixel unit 12 in a third row, different data signal lines VData input respective data signals into a plurality of first sub-pixels 10a, a plurality of second sub-pixels 10b, and a plurality of third sub-pixels 10c in the at least one second pixel unit 12 arranged in different columns, respective second pixel units 12 emit light of corresponding brightness.

When an arrangement of at least one first pixel unit 11 including two or more rows, since the at least one first pixel unit 11 arranged in different rows are connected to different scan signal lines, even if a same data signal line VData is used, by enabling different data signals at different times, the at least one first pixel unit 11 arranged in different rows can have different light-emitting brightness. Therefore, the light-emitting brightness of the at least one first pixel unit 11 in each row can be individually controlled.

If at least one second pixel unit 12 is provided in several rows close to the frame area 1b, in each of the at least one second pixel unit 12, light-emitting brightness of sub-pixels emitting a same color (such as, the plurality of first sub-pixels 10a, the plurality of second sub-pixels 10b or the plurality of third sub-pixels 10c) in respective rows in the at least one second pixel unit 12 is synchronously controlled. When the light-emitting brightness are adjusted synchronously, an edge of the display area 1a close to the frame area 1b will appear reddish in entire row (for example, a first row in the display area 1a is one row of sub-pixels with red color), greenish in entire row (for example, the first row in the display area 1a is one row of sub-pixels with green color)

or bluish in entire row (for example, the first row in the display area 1a is one row of sub-pixels with blue color), that is, a color deviation problem occurs. In embodiments of the present application, the light-emitting brightness of the at least one first pixel unit 11 in respective rows can be adjusted independently. Light-emitting brightness of the at least one first pixel unit 11 in respective rows can be controlled lower than light-emitting brightness of the at least one second pixel unit 12 in an adjacent row, thereby the above-mentioned color deviation problem can be alleviated.

In some embodiments, the plurality of first sub-pixels 10a, the plurality of second sub-pixels 10b, and the plurality of third sub-pixels 10c in the at least one first pixel unit 11 can be arranged in other manners, and the plurality of first sub-pixels 10a, the plurality of second sub-pixels 10b, and plurality of the third sub-pixels 10c in the at least one second pixel unit 12 can be arranged in other manners. Sub-pixels near the frame area 1b and independently controlled to emit light, such as, one row of the plurality of first sub-pixels 10a, the plurality of second sub-pixels 10b, or the plurality of third sub-pixels 10c in the at least one first pixel unit 11, can effectively alleviate the color deviation problem occurred in an edge of the display area 1a close to the frame area 1b. That is, the sub-pixels near the frame area 1b and independently controlled to emit light are the plurality of color deviation adjustment sub-pixels.

In some embodiments, a structure of a pixel driving circuit can be a 3T1C structure, a 6T1C structure, a 7T1C structure, or the like. A light-emitting transistor is added in a pixel driving circuit of the 3T1C structure compared with the 2T1C structure. A source of the light-emitting transistor is connected to a drain of the driving transistor, and a gate of the light-emitting transistor is connected to a light-emitting signal line. In some embodiments, pixel driving circuits of respective sub-pixels 10a, 10b, and 10c in the at least one first pixel unit 11 (or the at least one second pixel unit 12) arranged in a row are connected to a light-emitting signal line. In some embodiments, pixel driving circuits of sub-pixels 10a, 10b, and 10c in the at least one first pixel unit 11 (or the at least one second pixel unit 12) arranged in different rows are connected to different light-emitting signal lines. Signals of the light-emitting signal lines can come from the GIP circuit.

A pixel driving circuit of a 7T1C structure has a threshold voltage compensation process for sub-pixels 10a, 10b, and 10c during a light-emitting process, so that light-emitting uniformity of the sub-pixels 10a, 10b, and 10c can be ensured. Compared with the 7T1C structure, a pixel driving circuit of a 6T1C structure omits the light-emitting transistor.

In some embodiments, at least one first pixel unit 11 and at least one second pixel unit 12 can be passively driven to emit light. First electrodes 101a of a plurality of first sub-pixels 10a (or a plurality of second sub-pixels 10b, or a plurality of third sub-pixels 10c) in at least one first pixel unit 11 arranged in a row are connected to a same signal line, and first electrodes 101a of a plurality of first sub-pixels 10a (or a plurality of second sub-pixels 10b, or a plurality of third sub-pixels 10c) in at least one second pixel unit 12 arranged in a row are connected to a same signal line, and first electrodes 101a of a plurality of first sub-pixels 10a (or a plurality of second sub-pixels 10b, or a plurality of third sub-pixels 10c) in at least one first pixel unit 11 arranged in different rows are connected to different signal lines, first electrodes 101a of a plurality of first sub-pixels 10a (or a plurality of second sub-pixels 10b, or a plurality of third sub-pixels 10c) in at least one second pixel unit 12 arranged in different rows are connected to different signal lines. When a signal line selects the plurality of first sub-pixels 10a (or the plurality of second sub-pixels 10b, or the plurality of third sub-pixels 10c) in the at least one first pixel unit 11 corresponding to the signal line, signals of different column signal lines are input to second electrodes 101c of the plurality of first sub-pixels 10a (or the plurality of second sub-pixels 10b, or the plurality of third sub-pixels 10c) in the at least one first pixel unit 11 arranged in respective columns corresponding to the signal line. When a signal line selects the plurality of first sub-pixels 10a (or the plurality of second sub-pixels 10b, or the plurality of third sub-pixels 10c) in the at least one second pixel unit 12 corresponding to the signal line, signals of different column signal lines are input to second electrodes 101c of the plurality of first sub-pixels 10a (or the plurality of second sub-pixels 10b, or the plurality of third sub-pixels 10c) in the at least one second pixel unit 12 arranged in respective columns corresponding to the signal line. In this way, the at least one first pixel unit 11 arranged in respective rows and the at least one second pixel unit 12 arranged in respective rows emit light of different brightness.

In some embodiments, when a camera collects images through the transparent display area 1c, in order to reduce a diffraction problem due to light passing through the plurality of first sub-pixels 10a, the plurality of second sub-pixels 10b, and the plurality of third sub-pixels 10c in the at least one second pixel unit 12 or due to the light passing through an area between respective sub-pixels 10a, 10b and 10c in the at least one second pixel unit 12, an orthographic projection of the first electrode 101a on a plane where the substrate 10 is located can have a shape of circular, elliptical, dumbbell-shaped or gourd-shaped, so that the diffraction problem can be better solved.

Figure 5:
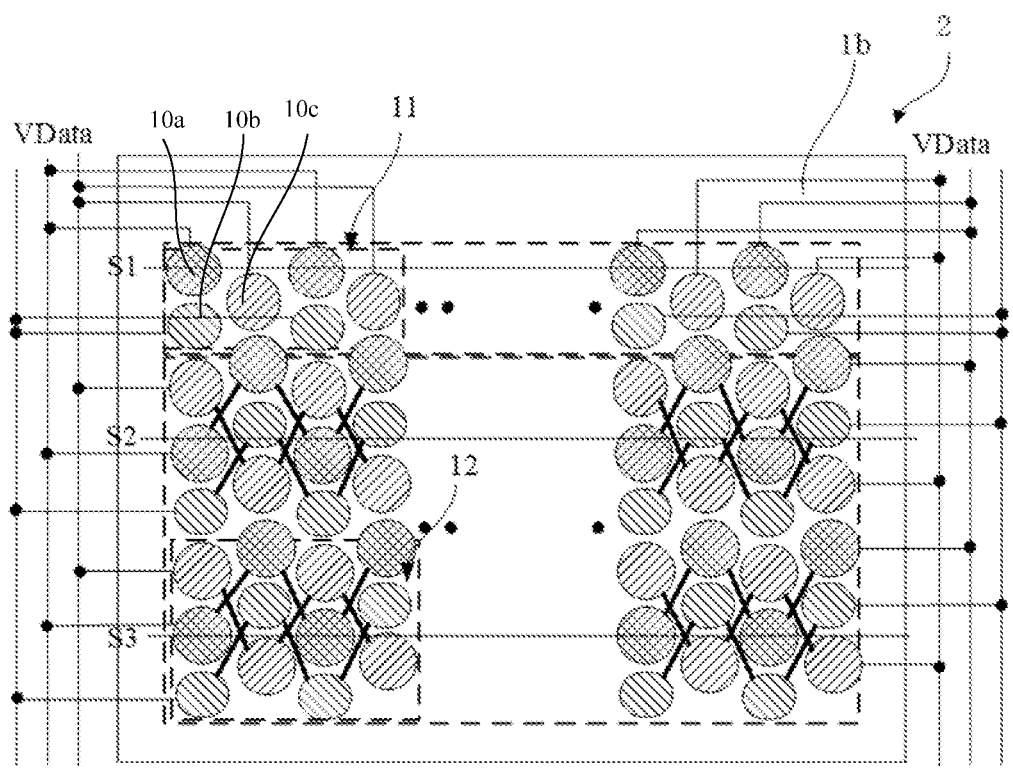
FIG. 5 is a schematic diagram illustrating a connecting relationship in which at least one first pixel unit and at least one second pixel unit in a display panel are respectively connected with scan signal lines and data signal lines according to embodiments of the present application.

FIG. 5 is a schematic diagram illustrating a connecting relationship in which at least one first pixel unit and at least one second pixel unit in a display panel are respectively connected with scan signal lines and data signal lines in a display panel according to embodiments of the present application. As shown in FIG. 5, a display panel 2 is substantially same as the display panel 1 in FIG. 1 to FIG. 4, except that pixel driving circuits of sub-pixels emitting a same color (such as, the plurality of first sub-pixels 10a, the plurality of second sub-pixels 10b, the plurality of third sub-pixels 10c) in at least one first pixel unit 11 and at least one second pixel unit 12 arranged in a column are connected to a same data signal line VData.

In this embodiment, the plurality of first sub-pixels 10a, the plurality of second sub-pixels 10b, and the plurality of third sub-pixels 10b in each of the at least one first pixel unit 11 are respectively arranged in Q columns, and the plurality of first sub-pixels 10a, the plurality of second sub-pixels 10b, and the plurality of third sub-pixels 10b in each of the at least one second pixel unit 12 are respectively arranged in Q columns, where Q is an even number and greater than or equal to 2.

The display panel 2 can further save a number of data signal lines VData. On the one hand, processes can be simplified to avoid reducing a light transmittance of the transparent display area 1c due to multiple data signal lines VData passing through the transparent display area 1c; on the other hand, a number of data signal channels of DDIC can be saved.

Figure 6:
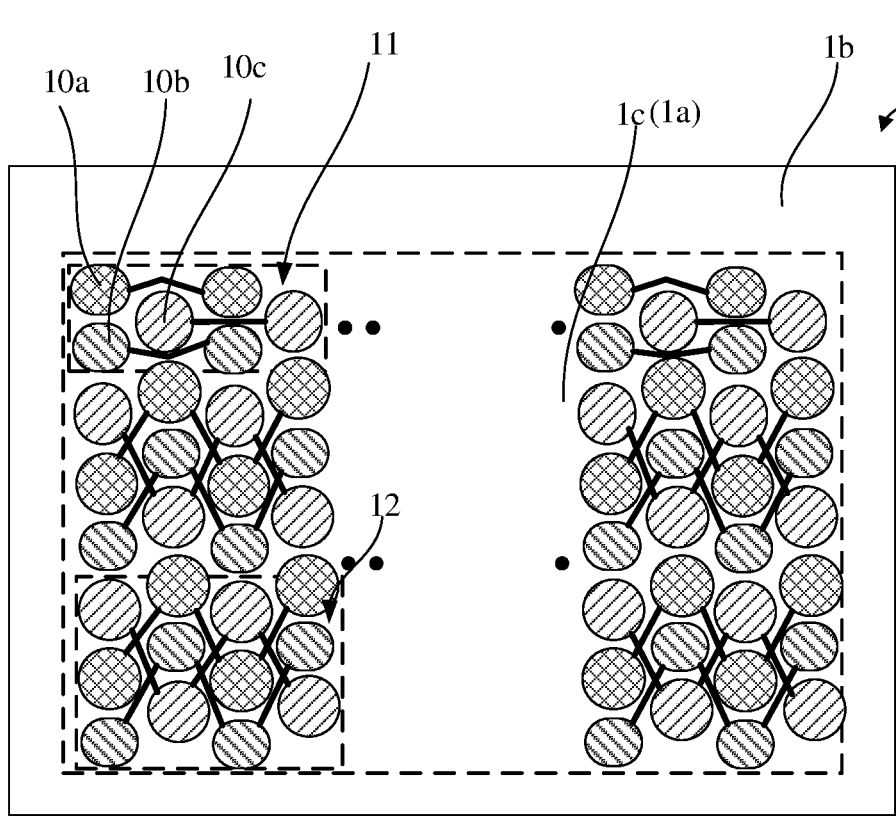
FIG. 6 is a top view of a display panel according to embodiments of the present application.

FIG. 6 is a top view of a display panel according to embodiments of the present application. As shown in FIG. 6, a display panel 3 is substantially same as the display panels 1 and 2 in FIG. 1 to FIG. 5, except that the at least one first pixel unit 11 are located in the transparent display area 1c.

In an embodiment, first electrodes 101a of respective first sub-pixels 10a, second sub-pixels 10b, and third sub-pixels 10c in the at least one first pixel unit 11 can be reflective anodes, for example, a material of the reflective anodes includes ITO, metallic silver, and ITO with laminated structure, and so on. The first electrodes can also be light-transmitting anodes, for example, a material of the light-transmitting anodes includes ITO for transparent display.

In each of the at least one first pixel unit 11, the first electrodes 101a of the sub-pixels emitting a same color (such as, the plurality of first sub-pixels 10a, the plurality of second sub-pixels 10b, the plurality of third sub-pixels 10c) are connected with each other, so that one pixel driving circuit can be used to drive multiple sub-pixels emitting a same color.

Figure 7:
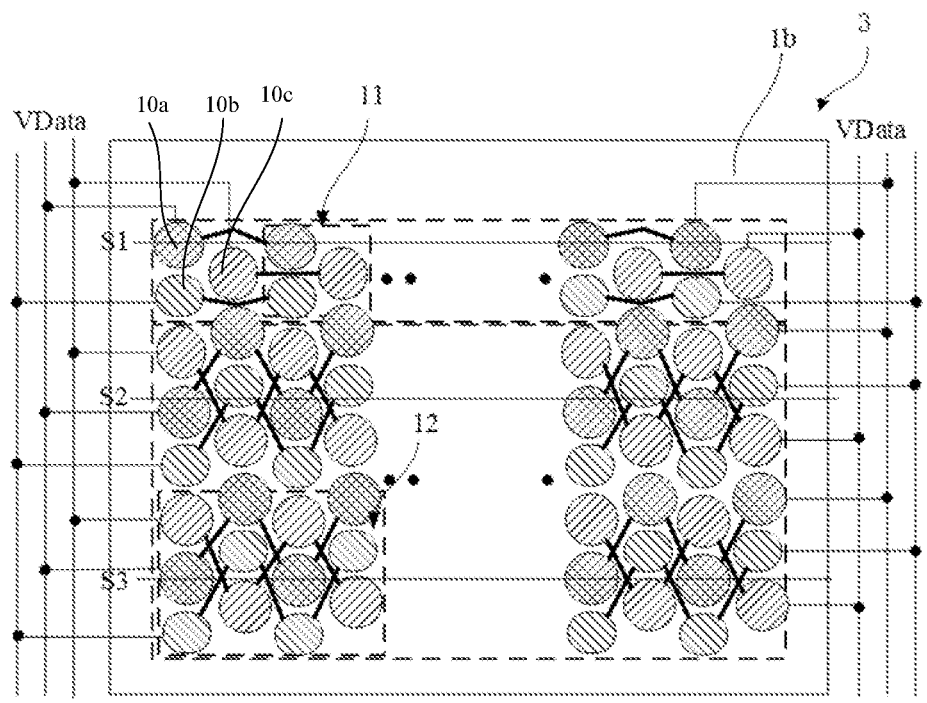
FIG. 7 is a schematic diagram illustrating a connecting relationship in which at least one first pixel unit and at least one second pixel unit in FIG. 6 are respectively connected with scan signal lines and data signal lines.

FIG. 7 is a schematic diagram illustrating a connecting relationship in which at least one first pixel unit and at least one second pixel unit in FIG. 6 are respectively connected with scan signal lines and data signal lines. Pixel driving circuits of respective sub-pixels emitting a same color (such as, the plurality of first sub-pixels 10a, the plurality of second sub-pixels 10b or the plurality of third sub-pixels 10c) in the at least one first pixel unit 11 and the at least one second pixel unit 12 arranged in a column are connected to a same data signal line VData. In some embodiments, pixel driving circuits of respective sub-pixels emitting a same color (such as, the plurality of first sub-pixels 10a, the plurality of second sub-pixels 10b or the plurality of third sub-pixels 10c) in the at least one first pixel unit 11 arranged in a column are connected to a same data signal line VData, and pixel driving circuits of respective sub-pixels emitting a same color (such as, the plurality of first sub-pixels 10a, the plurality of second sub-pixels 10b or the plurality of third sub-pixels 10c) in the at least one second pixel unit 12 arranged in a column are connected to a same data signal line VData.

Figure 8:
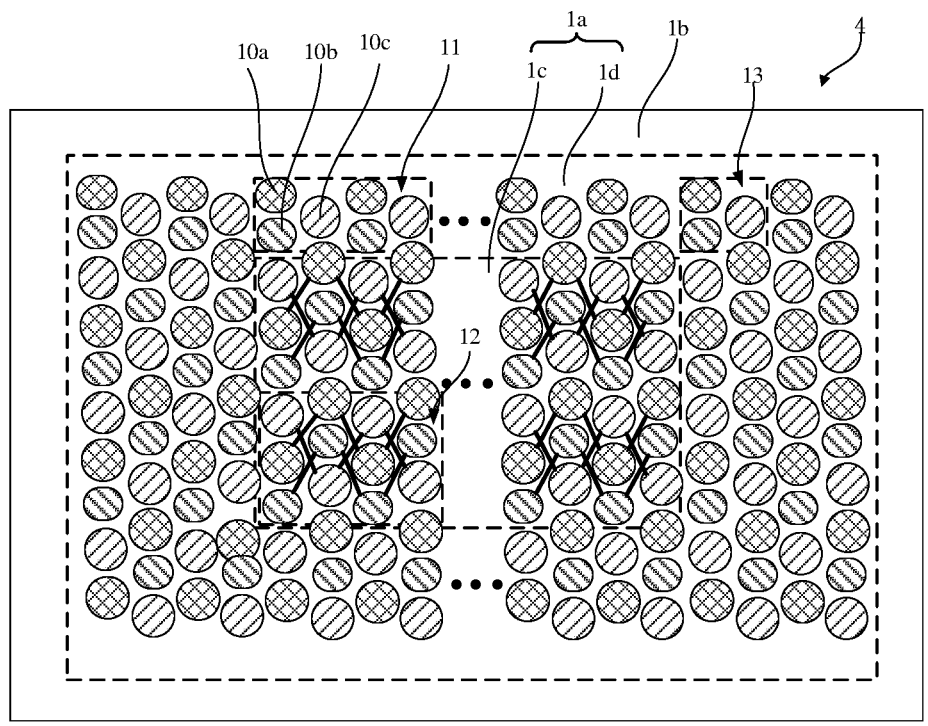
FIG. 8 is a top view of a display panel according to embodiments of the present application.

FIG. 8 is a top view of a display panel according to embodiments of the present application. Referring to FIG. 8, a display panel 4 of this embodiment is substantially same as the display panels 1, 2, and 3 in FIG. 1 to FIG. 7, except that a plurality of third pixel units 13 are further provided in the display area 1a, the display area 1 includes a non-transparent display area 1d, the plurality of third pixel units 13 are arranged in the non-transparent display area 1d.

In an embodiment, a number of the plurality of third pixel units 13 are arranged in a row with the at least one first pixel unit 11, a number of the plurality of third pixel units 13 are arranged in a row with the at least one second pixel unit 12, and a number of the plurality of third pixel units 13 are arranged in a single row or rows.

As shown in FIG. 8 and FIG. 4, the at least one first pixel unit 11, the at least one second pixel unit 12, and the plurality of third pixel units 13 can be actively driven to emit light. At this time, pixel driving circuits of respective sub-pixels 10a, 10b and 10c in the at least one first pixel unit 11 and the plurality of third pixel units 13 arranged in the first row are connected to a first scan signal line S1; pixel driving circuits of respective sub-pixels 10a, 10b and 10c in the at least one second pixel unit 12 and the plurality of third pixel units 13 arranged in the second row are connected to a second scan signal line S2; pixel driving circuits of respective sub-pixels 10a, 10b and 10c in the at least one second pixel unit 12 and the plurality of third pixel units 13 arranged in the third row are connected to a third scan signal line S3; and pixel driving circuits of sub-pixels emitting a same color (such as, the plurality of first sub-pixels 10a, the plurality of second sub-pixels 10b or the plurality of third sub-pixels 10c) in at least one first pixel unit 11, at least one second pixel unit 12 and a plurality of third pixel units 13 arranged in a column are connected to different data signal lines or a same data signal line VData.

In some embodiments, the at least one first pixel unit 11, the at least one second pixel unit 12, and the plurality of third pixel units 13 can be passively driven to emit light. At this time, first electrodes 101a of respective first sub-pixels 10a (or respective second sub-pixels 10b, or respective third sub-pixels 10c) in the at least one first pixel unit 11 and the plurality of third pixel units 13 arranged in the first row are connected to a signal line; first electrodes 101a of respective first sub-pixels 10a (or respective second sub-pixels 10b, or respective third sub-pixels 10c) in the at least one second pixel unit 12 and the plurality of third pixel units 13 arranged in the second row are connected to a signal line; first electrodes 101a of respective first sub-pixel 10a (or respective second sub-pixels 10b, or respective third sub-pixels 10c) in the at least one second pixel unit 12 and the plurality of third pixel units 13 arranged in the third row are connected to a signal line; first electrodes 101a of respective first sub-pixel 10a (or respective second sub-pixels 10b, or respective third sub-pixels 10c) in at least one first pixel unit 11, at least one second pixel unit 12 and plurality of third pixel units 13 arranged in a column are connected to different signal lines or a same signal line.

In the embodiment shown in FIG. 8, the transparent display area 1c has a rectangular shape. In other embodiments, the transparent display area 1c can have a circular shape, an oval shape, a drop shape, or the like.

Based on the above-mentioned display panels 1, 2, 3, 4, the present application further provides a display device.

For example, the display device can be a mobile phone, a tablet computer, or a car display screen.

The display device, including:
a device body including a component area; and
the display panel described in any of the above embodiments, where the display panel covers the device body;
the component area is located under the transparent display area 1c of the display panels 1, 2, 3, 4, and at least one photosensitive component that emits or collects light through the transparent display area 1c is arranged in the component area.

The at least one photosensitive component can include at least one of a camera, an infrared sensor, an infrared lens, a flood light sensor, an ambient light sensor, and a dot projector.

Although the present application is disclosed above, the present application is not limited thereto. Any changes and modifications may be made by those skilled in the art without departing from the spirit and scope of the application, and the protection scope of the present application shall be defined by the content of the claims.

The invention claimed is:

1. A display panel, having a display area and a frame area, and comprising:
at least one first pixel unit disposed in the display area close to the frame area;
at least one second pixel unit disposed in the display area away from the frame area, wherein each second pixel unit of the at least one second pixel unit comprises a plurality of sub-pixels, comprising a plurality of first sub-pixels, a plurality of second sub-pixels and a plurality of third sub-pixels alternately distributed in a column direction and emitting three different primary colors respectively, the plurality of sub-pixels emitting a same color in each of the at least one second pixel unit being synchronously controlled to emit light; and a plurality of color deviation adjustment sub-pixels disposed in the display area and between the at least one second pixel unit and the frame area, the plurality of color deviation adjustment sub-pixels being independently controlled to emit light and light-emitting brightness of the at least one first pixel unit in respective rows is configured to be controlled lower than light-emitting brightness of the at least one second pixel unit in an adjacent row.

2. The display panel according to claim 1, wherein the plurality of color deviation adjustment sub-pixels emit colors selected from the three primary colors.

3. The display panel according to claim 1, further comprising
wherein each first pixel unit of the at least one first pixel unit comprises a plurality of sub-pixels comprising three rows of first sub-pixels, second sub-pixels and third sub-pixels alternately distributed in the column direction, each row of the at least one first pixel unit comprises a plurality of sub-pixels emitting a same color and the plurality of color deviation adjustment sub-pixels are selected from the first sub-pixels, the second sub-pixels or the third sub-pixels in the at least one first pixel unit close to the frame area.

4. The display panel according to claim 1, wherein the plurality of first sub-pixels, the plurality of second sub-pixels and the plurality of third sub-pixels in each of the at least one second pixel unit are disposed in 3N rows and alternately distributed in the column direction, wherein N≥2, and the plurality of sub-pixels emitting a same color and located in an Nth row in each of the at least one second pixel unit are electrically connected with each other to be synchronously controlled to emit light.

5. The display panel according to claim 3, wherein a plurality of pixel driving circuits of respective sub-pixels in the at least one first pixel unit arranged in a row is connected to a same scan signal, and a plurality of pixel driving circuits of respective sub-pixels of the at least one first pixel unit arranged in different rows is connected to different scan signal lines.

6. The display panel according to claim 5, wherein a plurality of pixel driving circuits of the plurality of sub-pixels emitting a same color in the at least one first pixel unit and the at least one second pixel unit arranged in a column are connected to a same data signal line.

7. The display panel according to claim 3, wherein a plurality of first electrodes of respective sub-pixels in the at least one first pixel unit arranged in a row are connected to a same signal line; a plurality of first electrodes of respective sub-pixels in the at least one second pixel unit arranged in a row are connected to a same signal line; and a plurality of first electrodes of respective sub-pixels in the at least one first pixel unit arranged in different rows are connected to different signal lines, a plurality of first electrodes of respective sub-pixels in the at least one second pixel unit arranged in different rows are connected to different signal lines.

8. The display panel according to claim 3, wherein the display area comprises a transparent display area and the at least one second pixel unit is located in the transparent display area.

9. The display panel according to claim 8, wherein the plurality of sub-pixels emitting a same color in each of the at least one second pixel unit located in the transparent display area are connected to a same pixel driving circuit, and the pixel driving circuit is located in the transparent display area.

10. The display panel according to claim 8, wherein the at least one first pixel unit is located in the transparent display area and a plurality of first electrodes of the plurality of sub-pixels emitting a same color in each of the at least one first pixel unit located in the transparent display area are connected with each other.

11. The display panel according to claim 10, wherein the first electrodes are reflective anodes or light-transmitting anodes.

12. The display panel according to claim 8, wherein the display area comprises a non-transparent display area and the at least one first pixel unit is located in the non-transparent display area.

13. The display panel according to claim 12, wherein a plurality of pixel driving circuits of sub-pixels emitting a same color in each of the at least one first pixel unit located in the non-transparent display area are connected to a same data signal line.

14. The display panel according to claim 3, wherein the at least one first pixel unit comprises one row of first pixel units or a plurality of rows of first pixel units and the at least one second pixel unit comprises a plurality of rows of second pixel units.

15. The display panel according to claim 14, wherein the plurality of first sub-pixels, the plurality of second sub-pixels and the plurality of third sub-pixels in each of the at least one first pixel unit are respectively arranged in Q columns, and the plurality of first sub-pixels, the plurality of second sub-pixels and the plurality of third sub-pixels in each of the at least one second pixel unit are respectively arranged in Q columns; wherein Q is an even number greater than or equal to 2.

16. The display panel according to claim 1, further comprising:
a plurality of third pixel units disposed in the display area, wherein the display area comprises a non-transparent display area, and the plurality of third pixel units is located in the non-transparent display area.

17. The display panel according to claim 16, wherein a number of the plurality of third pixel units are arranged in a row with the at least one first pixel unit, a number of the plurality of third pixel units are arranged in a row with the at least one second pixel unit, and a number of the plurality of third pixel units are arranged in a single row or rows.

18. The display panel according to claim 16, wherein a plurality of pixel driving circuits of respective sub-pixels in the at least one first pixel unit and the plurality of third pixel units arranged in a row are connected to a same scan signal line; a plurality of pixel driving circuits of respective sub-pixels in the at least one second pixel unit and the plurality of third pixel units arranged in a row are connected to a same scan signal line; and a plurality of pixel driving circuits of respective sub-pixels emitting a same color in the at least one first pixel unit, the at least one second pixel units and the plurality of third pixel units arranged in a column are connected to a same data signal line or different data signal lines.

19. The display panel according to claim 16, wherein a plurality of first electrodes of respective sub-pixels in the at least one first pixel unit and the plurality of third pixel units arranged in a row are connected to a same signal line; a plurality of first electrodes of respective sub-pixels in the at least one second pixel unit and the plurality of third pixel units arranged in a row are connected to a same signal line;

and a plurality of first electrodes of respective sub-pixels emitting a same color in the at least one first pixel unit, the at least one second pixel unit and the plurality of third pixel units arranged in a column are connected to a same signal line or different signal lines.

20. The display panel of claim 1, wherein light-emitting brightness of the at least one first pixel unit in each row is configured to be individually controlled.

* * * * *